United States Patent
Sui et al.

(10) Patent No.: US 12,052,920 B1
(45) Date of Patent: Jul. 30, 2024

(54) PREPARATION METHOD OF CONTACT MATERIAL WITH HIGH THERMAL STABILITY AND LOW CONTACT RESISTANCE BASED ON MgAgSb-BASED THERMOELECTRIC MATERIAL

(71) Applicant: HARBIN INSTITUTE OF TECHNOLOGY, Heilongjiang (CN)

(72) Inventors: Jiehe Sui, Heilongjiang (CN); Liangjun Xie, Heilongjiang (CN); Zihang Liu, Heilongjiang (CN); Fengkai Guo, Heilongjiang (CN)

(73) Assignee: HARBIN INSTITUTE OF TECHNOLOGY, Harbin (CN)

( * ) Notice: Subject to any disclaimer, the term of this patent is extended or adjusted under 35 U.S.C. 154(b) by 0 days.

(21) Appl. No.: 18/533,907

(22) Filed: Dec. 8, 2023

Related U.S. Application Data

(63) Continuation of application No. PCT/CN2023/084140, filed on Sep. 27, 2023.

(30) Foreign Application Priority Data

Jan. 16, 2023 (CN) ......................... 202310063279.7

(51) Int. Cl.
| | |
|---|---|
| *H10N 10/01* | (2023.01) |
| *B22F 1/054* | (2022.01) |
| *B22F 3/12* | (2006.01) |
| *B22F 5/00* | (2006.01) |
| *B22F 9/04* | (2006.01) |
| *H10N 10/853* | (2023.01) |

(52) U.S. Cl.
CPC ............. *H10N 10/01* (2023.02); *B22F 1/054* (2022.01); *B22F 3/12* (2013.01); *B22F 5/006* (2013.01); *B22F 9/04* (2013.01); *B22F 2009/043* (2013.01); *B22F 2201/11* (2013.01); *B22F 2201/50* (2013.01); *B22F 2301/058* (2013.01); *B22F 2301/10* (2013.01); *B22F 2301/255* (2013.01); *B22F 2304/05* (2013.01); *H10N 10/853* (2023.02)

(58) Field of Classification Search
None
See application file for complete search history.

(56) References Cited

U.S. PATENT DOCUMENTS

| | | | |
|---|---|---|---|
| 2016/0326615 A1 | 11/2016 | Ren et al. | |
| 2018/0204992 A1 | 7/2018 | Wu et al. | |
| 2020/0044131 A1 | 2/2020 | Nakada | |
| 2023/0329115 A1* | 10/2023 | Mori ................... | H10N 10/855 252/62.3 T |

FOREIGN PATENT DOCUMENTS

| | | |
|---|---|---|
| CN | 104109785 A | 10/2014 |
| CN | 108767103 A | 11/2018 |
| CN | 109087987 A | 12/2018 |
| CN | 109524536 A | 3/2019 |
| CN | 114927609 A | 8/2022 |
| CN | 115347109 A | 11/2022 |
| KR | 20210112887 A | 9/2021 |
| WO | 2022059443 A1 | 3/2022 |

OTHER PUBLICATIONS

International Search Report of PCT/CN2023/084140.
Written Opinion of PCT/CN2023/084140.

* cited by examiner

*Primary Examiner* — Hsien Ming Lee

(57) ABSTRACT

The present disclosure provides a preparation method of a contact material with high thermal stability and low contact resistance based on an MgAgSb-based thermoelectric material and relates to the field of the contact materials preparation. The present disclosure aims to solve the problem of failure to achieve long-term stability for the MgAgSb/$Mg_3Bi_2$ device due to the fact that a contact material used by MgAgSb is Ag and MgAgSb may easily yield $Ag_3Sb$ in an Ag-rich environment at present. The method includes: at step 1, preparing MgCuSb nano-powder; at step 2, preparing $MgCu_{0.1}Ag_{0.87}Sb_{0.99}$ nano-powder; at step 3, preparing $MgCu_{0.1}Ag_{0.87}Sb_{0.99}$—$Mg_{3.2}Bi_{1.5}Sb_{0.5}$ thermoelectric generation device. The present disclosure is applied to preparation of a contact material with high thermal stability and low contact resistance based on an MgAgSb-based thermoelectric material.

10 Claims, 8 Drawing Sheets

PREPARATION METHOD OF CONTACT MATERIAL WITH HIGH THERMAL STABILITY AND LOW CONTACT RESISTANCE BASED ON MgAgSb-BASED THERMOELECTRIC MATERIAL

CROSS-REFERENCE TO RELATED APPLICATIONS

This Application is a bypass continuation application of PCT/CN2023/084140. This application claims priorities from PCT Application No. PCT/CN2023/084140, filed Mar. 27, 2023, and from the Chinese patent application 202310063279.7 filed Jan. 16, 2023, the content of which are incorporated herein in the entirety by reference.

TECHNICAL FIELD

The present disclosure relates to a preparation method of a contact material.

BACKGROUND

The thermoelectric devices based on thermoelectric materials can directly convert heat into electrical energy. The thermoelectric devices are usually formed by connecting a copper-coated ceramic plate with a thermoelectric material via solder. Before welding, it is required to introduce contact material on the surface of the thermoelectric material mainly to suppress elements diffusion and/or chemical reactions and improve solderable capability while maintaining low energy loss transport of heat and electricity between thermoelectric materials and electrode strips. During long service at elevated temperatures, high thermal stability and low contact resistance between the contact materials and the thermoelectric material are two key factors for ensuring the longevity of the device. The device that composed of the p-type MgAgSb-based thermoelectric material and n-type $Mg_3Bi_2$-based thermoelectric material exhibits high thermoelectric conversion efficiency in a temperature range from room temperature to 300° C. Up to now, Ag was selected as contact material for p-MgAgSb due to matched coefficient of thermal expansion, however, under Ag-rich conditions, a $Ag_3Sb$ phase can be easily formed at Ag/MgAgSb interface, which will lead to performance deterioration of MgAgSb/ $Mg_3Bi_2$ devices. Therefore, developing a new contact material with high stability and low contact resistance for MgAgSb is of great significance for the long-term stable service of the MgAgSb/$Mg_3Bi_2$-based thermoelectric devices.

SUMMARY

In order to solve the problem that the contact materials used by MgAgSb is Ag, while $Ag_3Sb$ is easy to be generated in MgAgSb in Ag-rich environment, which leads to that $MgAg_3Sb/Mg_3Bi_2$ device cannot realize long-term stability, and then a preparation method based on high thermal stability of MgAgSb-based thermoelectric material and low contact resistance contact materials is provided.

There is provided a preparation method of a contact material with high thermal stability and low contact resistance based on an MgAgSb-based thermoelectric material, which includes the following steps:

at step 1, in an argon atmosphere with a water oxygen content lower than 1 ppm, based on a stoichiometric ratio of a chemical formula MgCuSb, weighing Mg chips, Cu wires and Sb granules, and then, in a glove box, placing the weighed Mg chips, Cu wires, and Sb granules into a stainless steel high-energy ball mill tank and then placing stainless steel balls in and sealing the tank tightly to obtain a sealed ball mill tank; in an air atmosphere, placing the sealed ball mill tank into a high-energy ball mill machine for high-speed ball milling to obtain an MgCuSb nano-powder;

at step 2, in an argon atmosphere with a water oxygen content lower than 1 ppm, based on a stoichiometric ratio of a chemical formula $MgCu_{0.1}Ag_{0.87}Sb_{0.99}$, weighing Mg granules, Ag chips, Cu wires, and Sb granules, and obtaining an $MgCu_{0.1}Ag_{0.87}Sb_{0.99}$ nano-powder by ball milling;

at step 3, using the $MgCu_{0.1}Ag_{0.87}Sb_{0.99}$ nano-powder as a p-type material and the MgCuSb nano-powder as a contact material material of the p-type material; meanwhile, using $Mg_{3.2}Bi_{1.5}Sb_{0.5}$ as an n-type material, and Fe as a contact material material of the n-type material, so as to prepare an $MgCu_{0.1}Ag_{0.87}Sb_{0.99}$—$Mg_{3.2}Bi_{1.5}Sb_{0.5}$ thermoelectric generation device.

The present disclosure has the following beneficial effects.

In the present disclosure, a metal phase MgCuSb is used as the MgAgSb contact materials material. Firstly, MgCuSb and MgAgSb ($MgCu_{0.1}Ag_{0.87}Sb_{0.99}$) have similar thermal expansion coefficients, which can ensure an interface formed by both of them has a smaller thermal stress, so as to obtain a higher interface bonding strength. Secondly, a work function of the metal phase MgCuSb is higher than that of the p-type semiconductor MgAgSb, and thus both of them can form good ohmic contact, so as to form a lower contact resistance on the interface. More importantly, since two phase equilibrium is formed between these two materials, good thermal stability is generated. The prepared MgAgSb/MgCuSb interface still has good thermal stability after being annealed for 16 days at the temperature of 280° C. (553K), and the diffusion layer is smaller than 20 μm and has no reactant. Meanwhile, the interface maintains good ohmic contact with a contact resistance of less than 1 $\mu\Omega cm^2$, satisfying the device preparation requirements.

The present disclosure provides a preparation method of preparation method of a contact material with high thermal stability and low contact resistance based on an MgAgSb-based thermoelectric material.

BRIEF DESCRIPTIONS OF THE DRAWINGS

FIG. 1 is a comparison diagram of thermal expansion coefficients, where 1 refers to an MgCuSb nano-powder prepared in step 1 in a first embodiment, and 2 refers to an $MgCu_{0.1}Ag_{0.87}Sb_{0.99}$ nano-powder prepared in step 2 in a first embodiment.

DETAILED DESCRIPTIONS OF EMBODIMENTS

Figure 1:
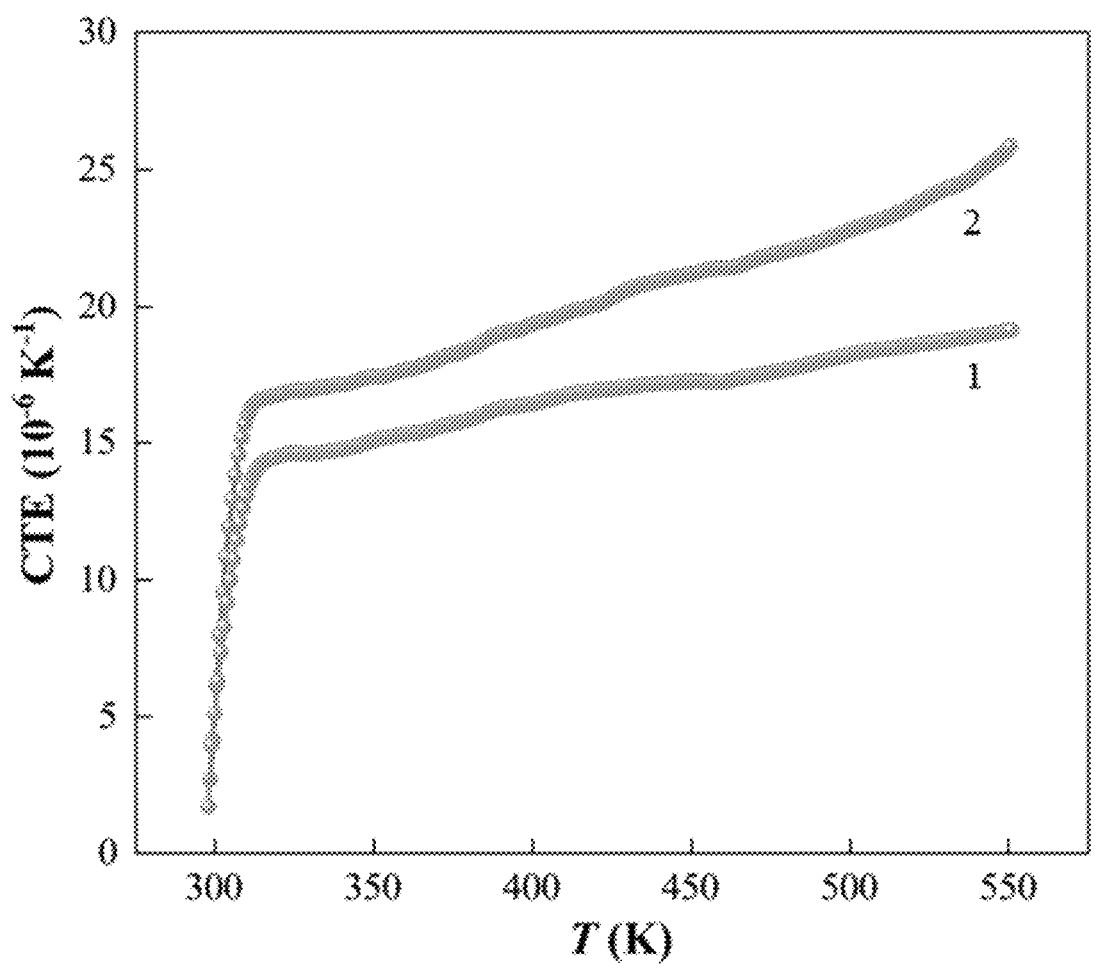

The technical scheme of the present disclosure is not limited to the below-listed specific embodiments and may also include any combination between the specific embodiments.

Embodiment 1: This embodiment provides a preparation method of a contact materialr with high thermal stability and low contact resistance based on an MgAgSb-based thermoelectric material, which includes the following steps:

at step 1, in an argon atmosphere with a water oxygen content lower than 1 ppm, based on a stoichiometric ratio of a chemical formula MgCuSb, weighing Mg chips, Cu wires and Sb granules, and then, in a glove box, placing the weighed Mg chips, Cu wires, and Sb granules into a stainless steel high-energy ball mill tank and then placing stainless steel balls in and sealing the tank tightly to obtain a sealed ball mill tank; in an air atmosphere, placing the sealed ball mill tank into a high-energy ball mill machine for high-speed ball milling to obtain an MgCuSb nano-powder;

at step 2, in an argon atmosphere with a water oxygen content lower than 1 ppm, based on a stoichiometric ratio of a chemical formula $MgCu_{0.1}Ag_{0.87}Sb_{0.99}$, weighing Mg granules, Ag chips, Cu wires, and Sb granules, and obtaining an $MgCu_{0.1}Ag_{0.87}Sb_{0.99}$ nano-powder by ball milling;

at step 3, using the $MgCu_{0.1}Ag_{0.87}Sb_{0.99}$ nano-powder as a p-type material and the MgCuSb nano-powder as a contact material material of the p-type material; meanwhile, using $Mg_{3.2}Bi_{1.5}Sb_{0.5}$ as an n-type material, and Fe as a contact material material of the n-type material, so as to prepare an $MgCu_{0.1}Ag_{0.87}Sb_{0.99}$—$Mg_{3.2}Bi_{1.5}Sb_{0.5}$ thermoelectric generation device.

The embodiment has the following beneficial effects.

In this embodiment, a metal phase MgCuSb is used as the MgAgSb contact materials material. Firstly, MgCuSb and MgAgSb ($MgCu_{0.1}Ag_{0.87}Sb_{0.99}$) have similar thermal expansion coefficients, which can ensure an interface formed by both of them has a smaller thermal stress, so as to obtain a higher interface bonding strength. Secondly, a work function of the metal phase MgCuSb is higher than that of the p-type semiconductor MgAgSb, and thus both of them can form good ohmic contact, so as to form a lower contact resistance on the interface. More importantly, since two phase equilibrium is formed between these two materials, good thermal stability is generated. The prepared MgAgSb/MgCuSb interface still has good thermal stability after being annealed for 16 days at the temperature of 280° C. (553K), and the diffusion layer is smaller than 20 μm and has no reactant. Meanwhile, the interface maintains good ohmic contact with a contact resistance of less than 1 $\mu\Omega cm^2$, satisfying the device preparation requirements.

Embodiment 2: this embodiment differs from the embodiment 1 in that: the high-speed ball milling in the step 1 specifically refers to that under the condition of 1000 r/m to 1500 r/m of the motor, performing ball milling for 18 h to 22 h. Others are the same as the embodiment 1.

Embodiment 3: this embodiment differs from the embodiment 1 or 2 as follows: in the step 2, in an argon atmosphere with a water oxygen content lower than 1 ppm, adding the Mg granules and Ag chips into the stainless steel ball mill tank and placing stainless steel balls in and sealing the tank tightly to obtain a sealed ball mill tank; in an air atmosphere, placing the sealed ball mill tank into a high-energy ball mill machine to perform high-speed ball milling for 9 h to 11 h under the condition of 1000 r/m to 1500 r/m of the motor; then, in an argon atmosphere with a water oxygen content lower than 1 ppmm, opening the ball mill tank, and adding the Cu wires and Sb granules and then sealing the tank tightly, and continuing high-speed ball milling for 9 h to 11 h under the condition of 1000 r/m to 1500 r/m of the motor, and in an argon atmosphere with a water oxygen content lower than 1 ppmm, opening the ball mill tank to obtain the $MgCu_{0.1}Ag_{0.87}Sb_{0.99}$ nano-powder. Others are the same as the embodiment 1 or 2.

Embodiment 4: this embodiment differs from one of the embodiments 1 to 3 as follows: in the step 3, using the $MgCu_{0.1}Ag_{0.87}Sb_{0.99}$ nano-powder as the p-type material and the MgCuSb nano-powder as the contact materials material of the p-type material specifically comprises the following steps: placing the MgCuSb nano-powder into a graphite mould and flattening the MgCuSb nano-powder to obtain a first MgCuSb layer; placing the $MgCu_{0.1}Ag_{0.87}Sb_{0.99}$ nano-powder on the first MgCuSb layer and flattening the $MgCu_{0.1}Ag_{0.87}Sb_{0.99}$ nano-powder to obtain an $MgCu_{0.1}Ag_{0.87}Sb_{0.99}$ layer, and then placing MgCuSb nano-powder on the $MgCu_{0.1}Ag_{0.87}Sb_{0.99}$ layer and flattening the MgCuSb nano-powder to obtain a second MgCuSb layer, thus obtaining a mould loaded with MgCuSb—MgAgSb—MgCuSb; in an air atmosphere, placing the mould loaded with MgCuSb—MgAGSb—MgCuSb into an induction heating sintering furnace for sintering and cooling along with the furnace to obtain an MgCuSb—MgAgSb—MgCuSb sandwich structure sheet, and cutting the MgCuSb—MgAgSb—MgCuSb sandwich structure sheet into long strips so as to obtain MgCuSb—MgAgSb—MgCuSb long-strip test pieces. Others are the same as the embodiments 1 to 3.

Embodiment 5: this embodiment differs from any one of the embodiments 1 to 4 as follows: the sintering specifically comprises: under the condition of a furnace pressure lower than 10 Pa, at a temperature increasing rate of 80K/min to 120K/min, increasing a temperature to 563K to 583K, and then sintering for 20 min to 40 min under the condition of a sintering temperature of 563K to 583K and a pressure of 80 MPa to 90 MPa. Others are the same as the embodiments 1 to 4.

Embodiment 6: this embodiment differs from one of the embodiments 1 to 5 as follows: a height of the MgCuSb—MgAgSb—MgCuSb long-strip test pieces is 2.5 mm to 3.5 mm. Others are the same as the embodiments 1 to 5.

Embodiment 7: this embodiment differs from the embodiments 1 to 6 as follows: in the step 3, using the $Mg_{3.2}Bi_{1.5}Sb_{0.5}$ as the n-type material and Fe as the contact materials material of the n-type material specifically comprises the following steps: placing Fe powder into a graphite mould and flattening the Fe powder to obtain a first Fe layer; placing the $Mg_{3.2}Bi_{1.5}Sb_{0.5}$ nano-powder on the first Fe layer and flattening the $Mg_{3.2}Bi_{1.5}Sb_{0.5}$ nano-powder to obtain an MgBiSb layer, and then placing Fe powder on the MgBiSb layer and flattening the Fe powder to obtain a second Fe layer, thus obtaining a mould loaded with Fe—MgBiSb—Fe; in an air atmosphere, placing the mould loaded with Fe—MgBiSb—Fe in the induction heating sintering furnace for sintering and cooling along with the furnace to obtain a Fe—MgBiSb—Fe sandwich structure sheet and cutting the Fe—MgBiSb—Fe sandwich structure sheet into long strips to obtain Fe—MgBiSb—Fe long-strip test pieces. Others are the same as the embodiments 1 to 6.

Embodiment 8: this embodiment differs from one of the embodiments 1 to 7 as follows: the sintering specifically comprises: under the condition of the furnace pressure lower than 10 Pa, at the temperature increasing rate of 80K/min to 120K/min, increasing the temperature to 1053K to 1093K and then sintering for 15 min to 30 min under the condition of the sintering temperature of 1053K to 1093K and the pressure of 40 MPa to 60 MPa. Others are the same as the embodiments 1 to 7.

Embodiment 9: this embodiment differs from one of the embodiments 1 to 8 as follows: a height of the Fe—MgBiSb—Fe long-strip test pieces is 2.5 mm to 3.5 mm. Others are the same as the embodiments 1 to 8.

Embodiment 10: this embodiment differs from one of the embodiments 1 to 9 as follows: in the step 3, the $MgCu_{0.1}Ag_{0.87}Sb_{0.99}$—$Mg_{3.2}Bi_{1.5}Sb_{0.5}$ thermoelectric generation device is assembled by seven p-n pairs of $MgCu_{0.1}Ag_{0.87}Sb_{0.99}$—$Mg_{3.2}Bi_{1.5}Sb_{0.5}$. Others are the same as the embodiments 1 to 9.

The beneficial effects of the present disclosure are verified by the following embodiments.

Embodiment 1

There is provided a preparation method of a contact material with high thermal stability and low contact resistance based on an MgAgSb-based thermoelectric material, which includes the following steps:

at step 1, in an argon atmosphere with a water oxygen content lower than 1 ppm, based on a stoichiometric ratio of a chemical formula MgCuSb, weighing Mg chips, Cu wires and Sb granules, and then, in a glove box, placing the weighed Mg chips (99.99%, Alfa), Cu wires (99.999%, Alfa) and Sb granules (99.99%, Alfa) into a stainless steel high-energy ball mill tank and then placing stainless steel balls in and sealing the tank tightly to obtain a sealed ball mill tank; in an air atmosphere, placing the sealed ball mill tank into a high-energy ball mill machine to perform high-speed ball milling for 20 h under the condition of 1200 r/m of the motor to obtain an MgCuSb nano-powder;

at step 2, in an argon atmosphere with a water oxygen content lower than 1 ppm, based on a stoichiometric ratio of a chemical formula $MgCu_{0.1}Ag_{0.87}Sb_{0.99}$, weighing Mg granules, Ag chips, Cu wires and Sb granules, and then, in an argon atmosphere with a water oxygen content lower than 1 ppm, adding the Mg granules and Ag chips into the stainless steel ball mill tank and placing stainless steel balls in and sealing the tank tightly to obtain a sealed ball mill tank; in an air atmosphere, placing the sealed ball mill tank into a high-energy ball mill machine to perform high-speed ball milling for 1 h under the condition of 1200 r/m of the motor; then, in an argon atmosphere with a water oxygen content lower than 1 ppmm, opening the ball mill tank, and adding the Cu wires and Sb granules and then sealing the tank tightly, and continuing high-speed ball milling for 10 h under the condition of 1200 r/m of the motor, and in an argon atmosphere with a water oxygen content lower than 1 ppmm, opening the ball mill tank to obtain an $MgCu_{0.1}Ag_{0.87}Sb_{0.99}$ nano-powder;

at step 3, placing 0.3 g of MgCuSb nano-powder into a graphite mould and flattening the MgCuSb nano-powder to obtain a first MgCuSb layer; placing 2.2 g of $MgCu_{0.1}Ag_{0.87}Sb_{0.99}$ nano-powder on the first MgCuSb layer and flattening the $MgCu_{0.1}Ag_{0.87}Sb_{0.99}$ nano-powder to obtain an $MgCu_{0.1}Ag_{0.87}Sb_{0.99}$ layer, and then placing 0.3 g of MgCuSb nano-powder on the $MgCu_{0.1}Ag_{0.87}Sb_{0.99}$ layer and flattening the MgCuSb nano-powder to obtain a second MgCuSb layer, thus obtaining a mould loaded with MgCuSb—MgAgSb—MgCuSb; in an air atmosphere, placing the mould loaded with MgCuSb—MgAgSb—MgCuSb into an induction heating sintering furnace and heating the furnace to 573K at the temperature increasing rate of 100K/min under the condition of the furnace pressure of 5 Pa, and then sintering for 30 min under the condition of the sintering temperature of 573K and the pressure of 85 MPa, and cooling along with the furnace to obtain an MgCuSb—MgAgSb—MgCuSb sandwich structure sheet, and cutting the MgCuSb—MgAgSb—MgCuSb sandwich structure sheet into long strips so as to obtain MgCuSb—MgAgSb—MgCuSb long-strip test pieces;

at step 4, placing 0.2 g of Fe powder into a graphite mould and flattening the Fe powder to obtain a first Fe layer; placing 2.2 g of $Mg_{3.2}Bi_{1.5}Sb_{0.5}$ nano-powder on the first Fe layer and flattening the $Mg_{3.2}Bi_{1.5}Sb_{0.5}$ nano-powder to obtain an MgBiSb layer, and then placing 0.3 g of Fe powder on the MgBiSb layer and flattening the Fe powder to obtain a second Fe layer, thus obtaining a mould loaded with Fe—MgBiSb—Fe; in an air atmosphere, placing the mould loaded with Fe—MgBiSb—Fe in the induction heating sintering furnace, and heating the furnace to 1073K at the temperature increasing rate of 100K/min under the condition of the furnace pressure of 5 Pa, and then sintering for 20 min under the condition of the sintering temperature of 1073K and the pressure of 50 MPa, and cooling along with the furnace to obtain an Fe—MgBiSb—Fe sandwich structure sheet, and cutting the Fe—MgBiSb—Fe sandwich structure sheet into long strips so as to obtain Fe—MgBiSb—Fe long-strip test pieces;

at step 5, with $Al_2O_3$ ceramic as the upper and lower baseplates of the device, attaching seven Cu sheets on the upper baseplate, and attaching eight Cu sheets on the lower baseplate; with one MgCuSb—MgAgSb—MgCuSb long-strip test piece and one Fe—MgBiSb—Fe long-strip test piece as a pair of test pieces, welding seven pairs of test pieces onto the seven Cu sheets on the upper baseplate respectively by using solder to obtain a device with the upper end welding completed; welding the device with the upper end welding completed to the lower baseplate by using solder to obtain the $MgCu_{0.1}Ag_{0.87}Sb_{0.99}$—$Mg_{3.2}Bi_{1.5}Sb_{0.5}$ thermoelectric generation device.

In the step 3, the MgCuSb—MgAgSb—MgCuSb long-strip test pieces are 3.4 mm high, 1.5 mm long, and 1.5 mm wide.

In the step 4, the Fe—MgBiSb—Fe long-strip test pieces are 3.4 mm high, 1.5 mm long, and 1.5 mm wide.

In the step 5, the solder is $Pb_{92.5}Sn_{2.5}Ag_{2.5}$, and the solder is coated with a commercial-use wash-free neutral solder flux (tin print ET810PF); in the step 5, the Cu sheet and one pair of test pieces are formed into 1 L shape; in the step 5, the welding is performed on the heating bench of the temperature of 593K and stood for 30 s.

In the step 5, the size of the baseplates is $10 \times 10 \times 0.65$ $mm^3$; and in the step 5, the size of the Cu sheets is $4 \times 1.5 \times 0.1$ $mm^3$.

The $MgCu_{0.1}Ag_{0.87}Sb_{0.99}$—$Mg_{3.2}Bi_{1.5}Sb_{0.5}$ thermoelectric generation device prepared in the embodiment 1 is assembled by seven p-n pairs of $MgCu_{0.1}Ag_{0.87}Sb_{0.99}$—$Mg_{3.2}Bi_{1.5}Sb_{0.5}$.

FIG. 1 is a comparison diagram of thermal expansion coefficients, where 1 refers to the MgCuSb nano-powder prepared in the step 1 in the first embodiment, and 2 refers to the $MgCu_{0.1}Ag_{0.87}Sb_{0.99}$ nano-powder prepared in the step 2 in the first embodiment. It can be known from the above that the thermal expansion coefficients of both differ little, which helps MgCuSb as a contact material of MgAgSb ($MgCu_{0.1}Ag_{0.87}Sb_{0.99}$) to generate a possible minimum thermal stress on the interface, helping a long-term service of the device.

In the step 3, 0.3 g of MgCuSb nano-powder is placed into a graphite mould and flattened to obtain a first MgCuSb layer; 2.2 g of $MgCu_{0.1}Ag_{0.87}Sb_{0.99}$ nano-powder is placed on the first MgCuSb layer and flattened to obtain an $MgCu_{0.1}Ag_{0.87}Sb_{0.99}$ layer, and thus a mould loaded with MgCuSb—MgAgSb is obtained; in an air atmosphere, the mould loaded with MgCuSb—MgAgSb is placed into the induction heating sintering furnace; under the condition of the furnace pressure of 5 Pa, at the temperature increasing rate of 100K/min, the temperature is increased to 573K, and then under the condition of the sintering temperature of 573K and the pressure of 85 MPa, sintering is performed for 30 min and cooled along with the furnace to obtain an MgCuSb—MgAgSb structure, and then the MgCuSb—MgAgSb structure is cut into long strips to obtain MgCuSb—MgAgSb long-strip test pieces (MgCuSb—MgAgSb metal-p type semiconductor junction).

Figure 2:
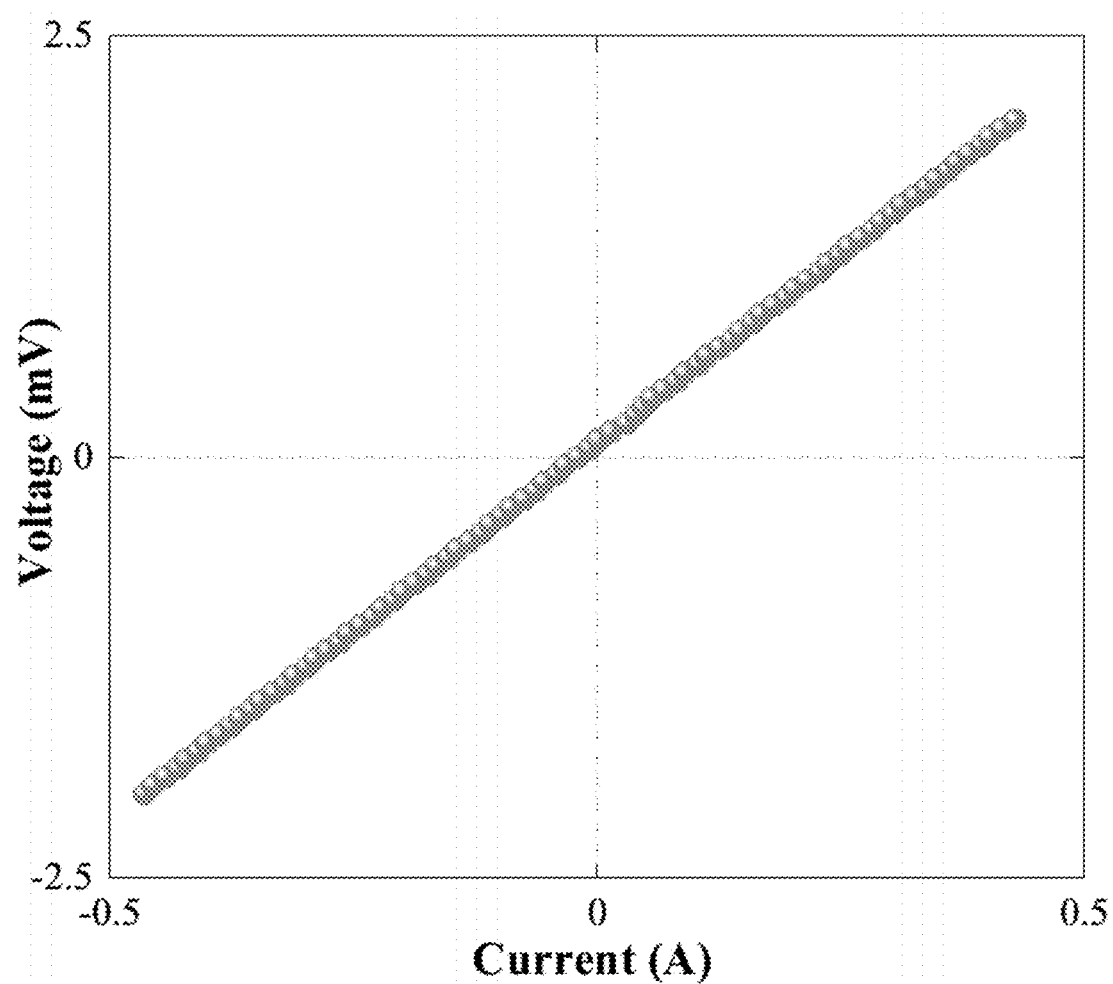
FIG. 2 is a volt-ampere characteristics curve of an MgCuSb—MgAgSb long-strip test piece.

FIG. 2 is a volt-ampere characteristics curve of an MgCuSb—MgAgSb long-strip test piece. It can be seen that this curve is a straight line crossing the origin, showing the metal phase MgCuSb and the MgAgSb semiconductor form good ohmic contact.

The MgCuSb—MgAgSb—MgCuSb sandwich structure sheets prepared in the step 3 are cut into long strips (3.4 mm high, 3 mm long, and 3 mm wide) which are then polished into regular cuboids. Every three long strips are placed into a quartz tube with a diameter of 15 mm. The air pressure in the quartz tube is lowered to 5 Pa by using a vacuum pump, and then the mouth of the quartz tube is melted by high temperature flame to seal the mouth of the quartz tube so as to keep the quartz tube in a vacuum state. Four quartz tubes in a vacuum state, each of which contains three MgCuSb—MgAgSb—MgCuSb long strips are prepared and then placed into a muffle furnace and then heated to 553k at the temperature increasing rate of 100K/min and held respectively for 1, 5, 10 and 16 days, and then cooled along with the furnace and then the annealed quartz tubes are cracked open to research on the interface structure and element distribution of the long strips annealed for different times and measure its interface resistance and analyze its high temperature stability, as shown in FIGS. 3 to 5.

Figure 3:
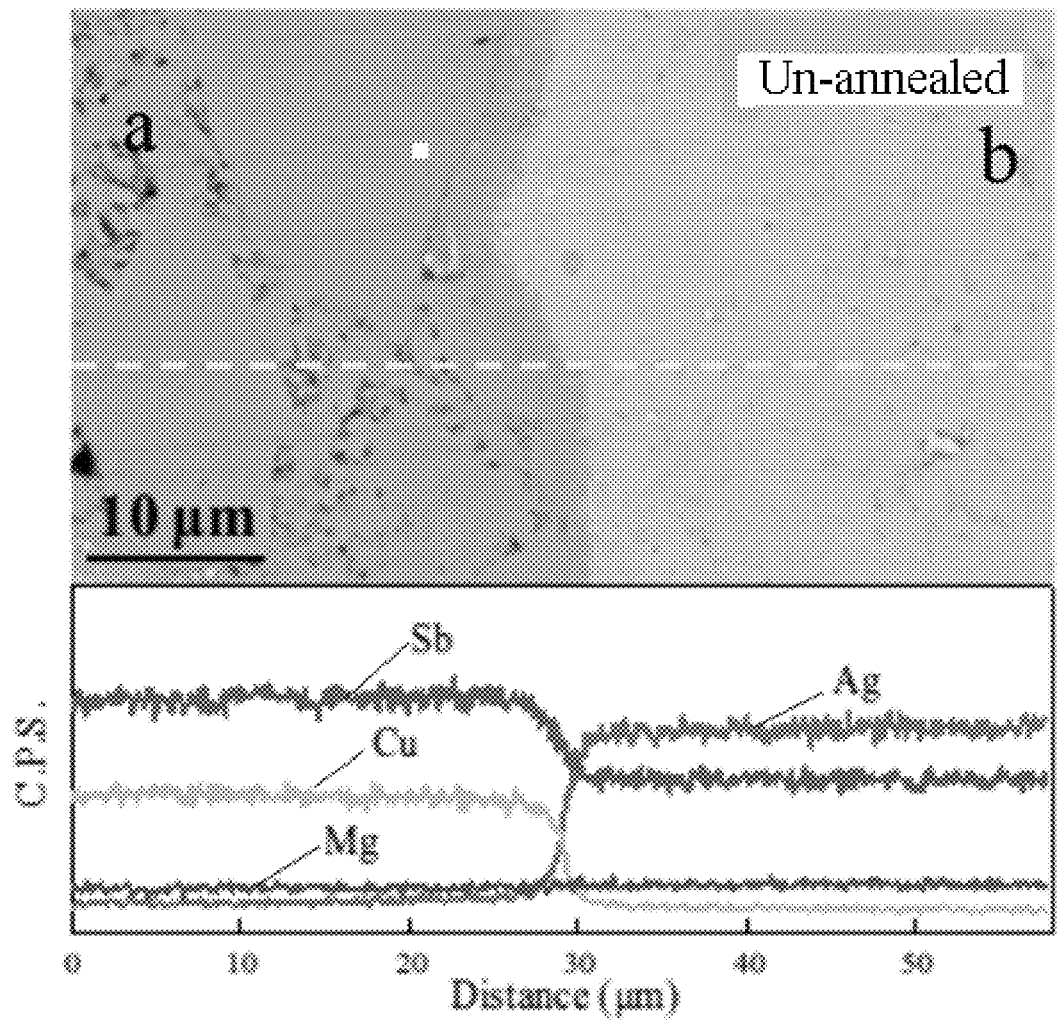
FIG. 3 is a backscatter electron scan image of an un-annealed interface of the MgCuSb—MgAgSb—MgCuSb long-strip test piece in step 3 and a scan result of the corresponding dotted line in a first embodiment, where a refers to MgCuSb layer and b refers to $MgCu_{0.1}Ag_{0.87}Sb_{0.99}$ layer.

FIG. 3 is a backscatter electron scan image of an un-annealed interface of the MgCuSb—MgAgSb—MgCuSb long-strip test piece in step 3 and a scan result of the corresponding dotted line in a first embodiment, where a refers to MgCuSb layer and b refers to $MgCu_{0.1}Ag_{0.87}Sb_{0.99}$ layer. It can be known from the drawing that the un-annealed contact materials has no obvious reaction with the material interface and the element distribution is uniform on the interface, and there is no crack inside the contact materials and the material.

Figure 4:
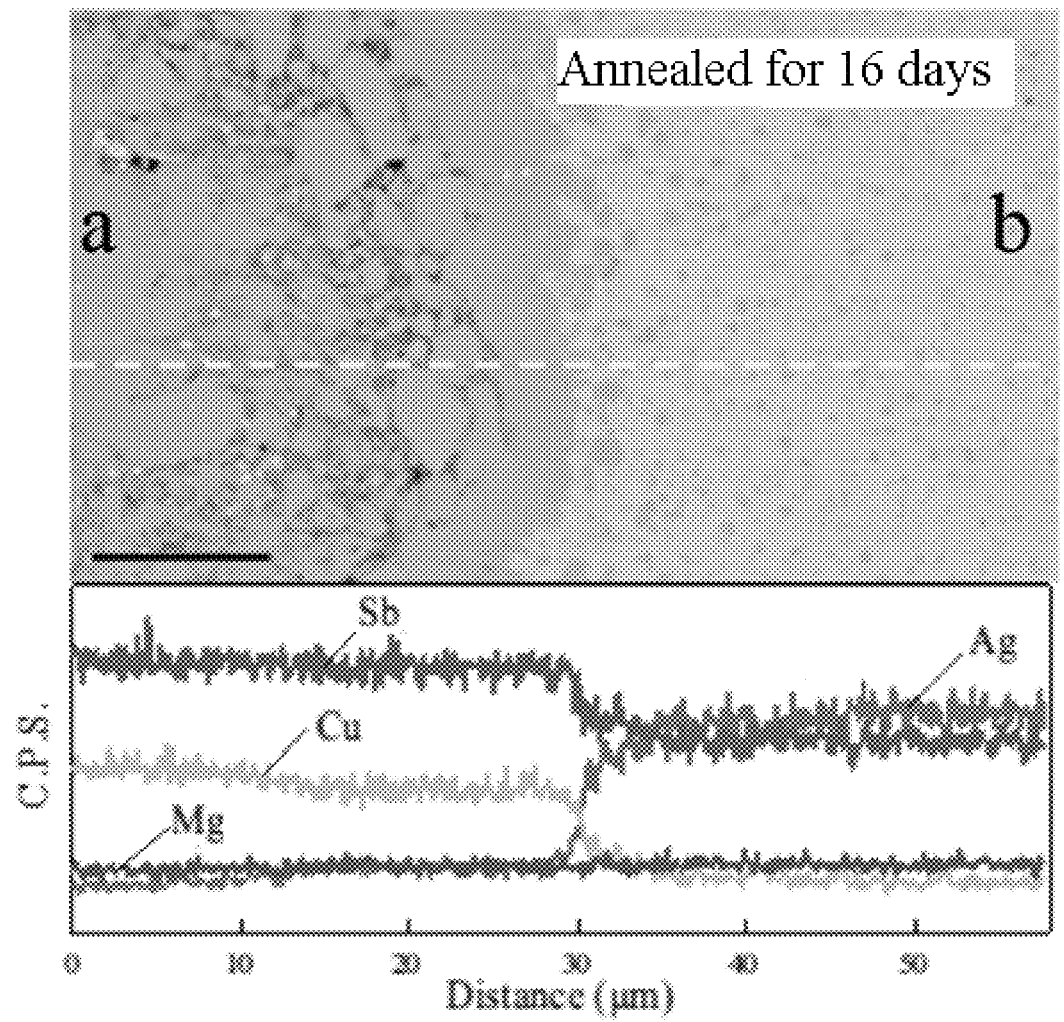
FIG. 4 is a backscatter electron scan image of an interface, annealed for 16 days at the temperature of 553K, of the MgCuSb—MgAgSb—MgCuSb long-strip test piece in step 3 and a scan result of the corresponding dotted line in a first embodiment, where a refers to MgCuSb layer and b refers to $MgCu_{0.1}Ag_{0.87}Sb_{0.99}$ layer.

FIG. 4 is a backscatter electron scan image of an interface, annealed for 16 days at the temperature of 553K, of the MgCuSb—MgAgSb—MgCuSb long-strip test piece in step 3 and a scan result of the corresponding dotted line in a first embodiment, where a refers to MgCuSb layer and b refers to $MgCu_{0.1}Ag_{0.87}Sb_{0.99}$ layer. It can be known from the drawing that after being annealed for 16 days at high temperatures, the sample and the contact materials are still distinct and the diffusion layer is only about 20 μm and there are no obvious second phases and cracks. It is shown that the contact materials has extremely good high temperature thermal stability.

Figure 5:
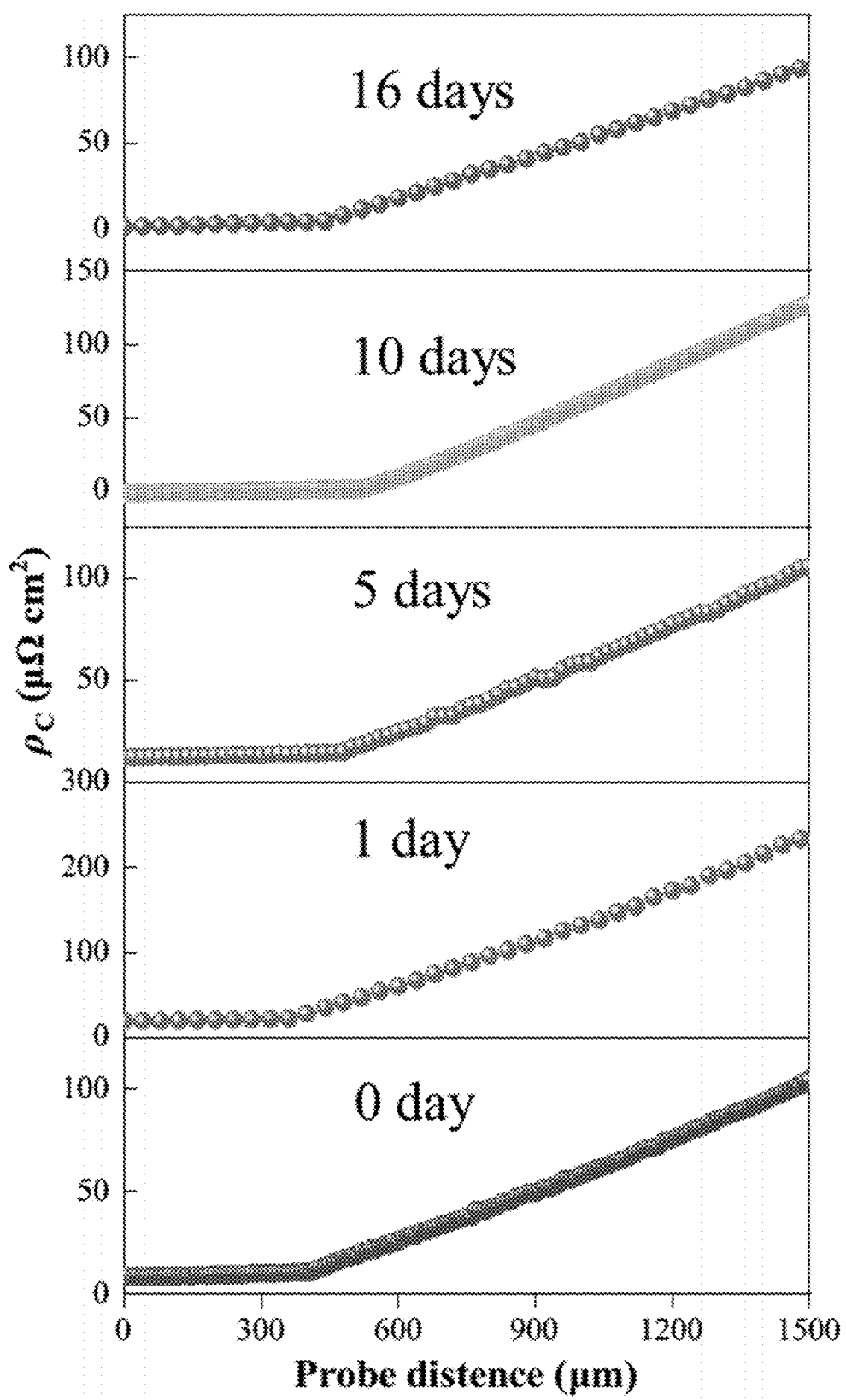
FIG. 5 is contact resistances of the MgCuSb—MgAgSb—MgCuSb long-strip test piece annealed for different times at the temperature of 553k in step 3 in a first embodiment.

FIG. 5 is contact resistances of the MgCuSb—MgAgSb—MgCuSb long-strip test piece annealed for different times at the temperature of 553k in step 3 in a first embodiment. It can be seen that after 16 days of anneal, the curve of the contact resistance between MgCuSb and MgAgSb has no obvious jump point, showing the device has no contact resistance within the precision range (1 $\mu\Omega cm^2$). Therefore, it can be concluded that there is good thermal stability and an extremely low contact resistance (less than 1$\mu\Omega cm^2$) between MgCuSb and MgAgSb, showing MgCuSb is a good contact materials material of MgAgSb.

Figure 6:
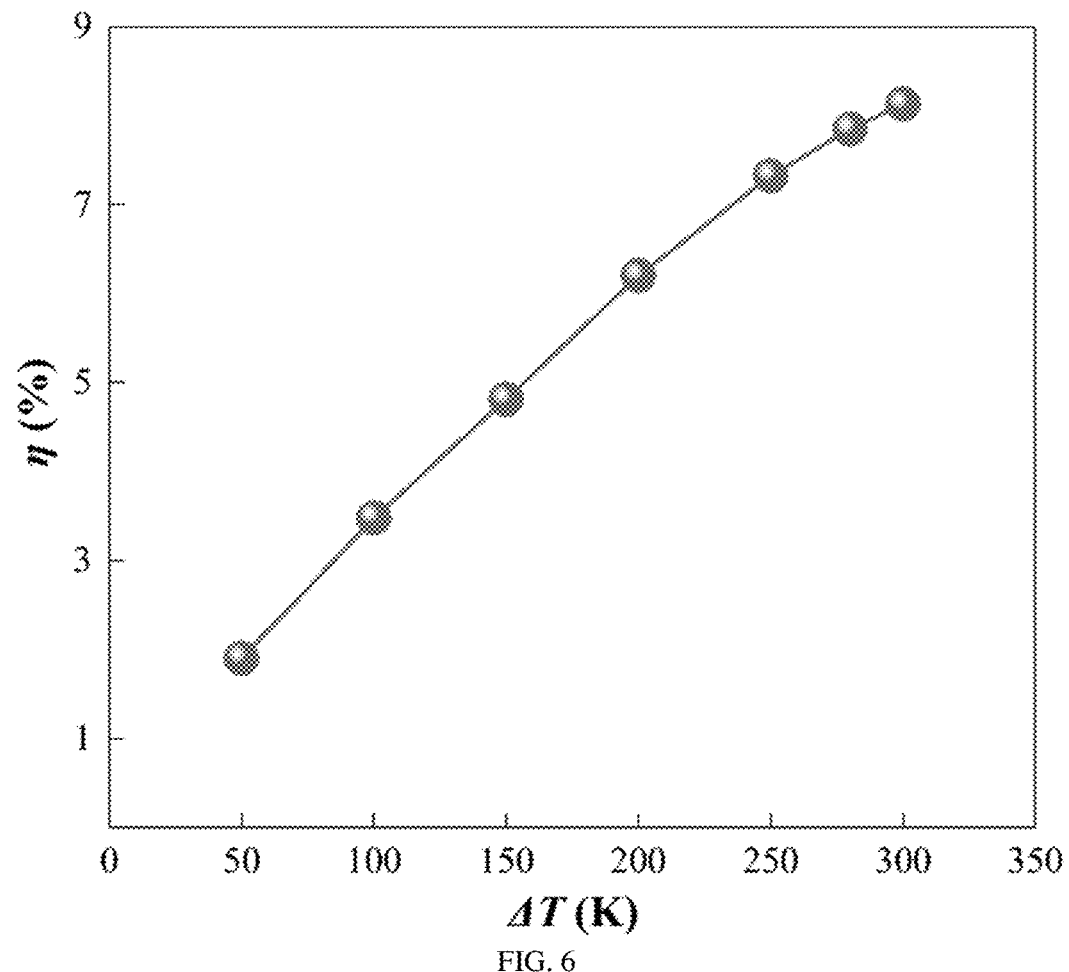
FIG. 6 is a curve diagram of the conversion efficiency of the $MgCu_{0.1}Ag_{0.87}Sb_{0.99}$—$Mg_{3.2}Bi_{1.5}Sb_{0.5}$ thermoelectric generation device prepared in a first embodiment along with temperature difference change.

FIG. 6 is a curve diagram of the conversion efficiency of the $MgCu_{0.1}Ag_{0.87}Sb_{0.99}$—$Mg_{3.2}Bi_{1.5}Sb_{0.5}$ thermoelectric generation device prepared in a first embodiment along with temperature difference change. It can be seen that as the temperature increases, the conversion efficiency of the device increases; and the conversion efficiency of the device reaches 8.13% at the low temperature of 293K and the high temperature of 593K (namely temperature difference of 300K).

Figure 7:
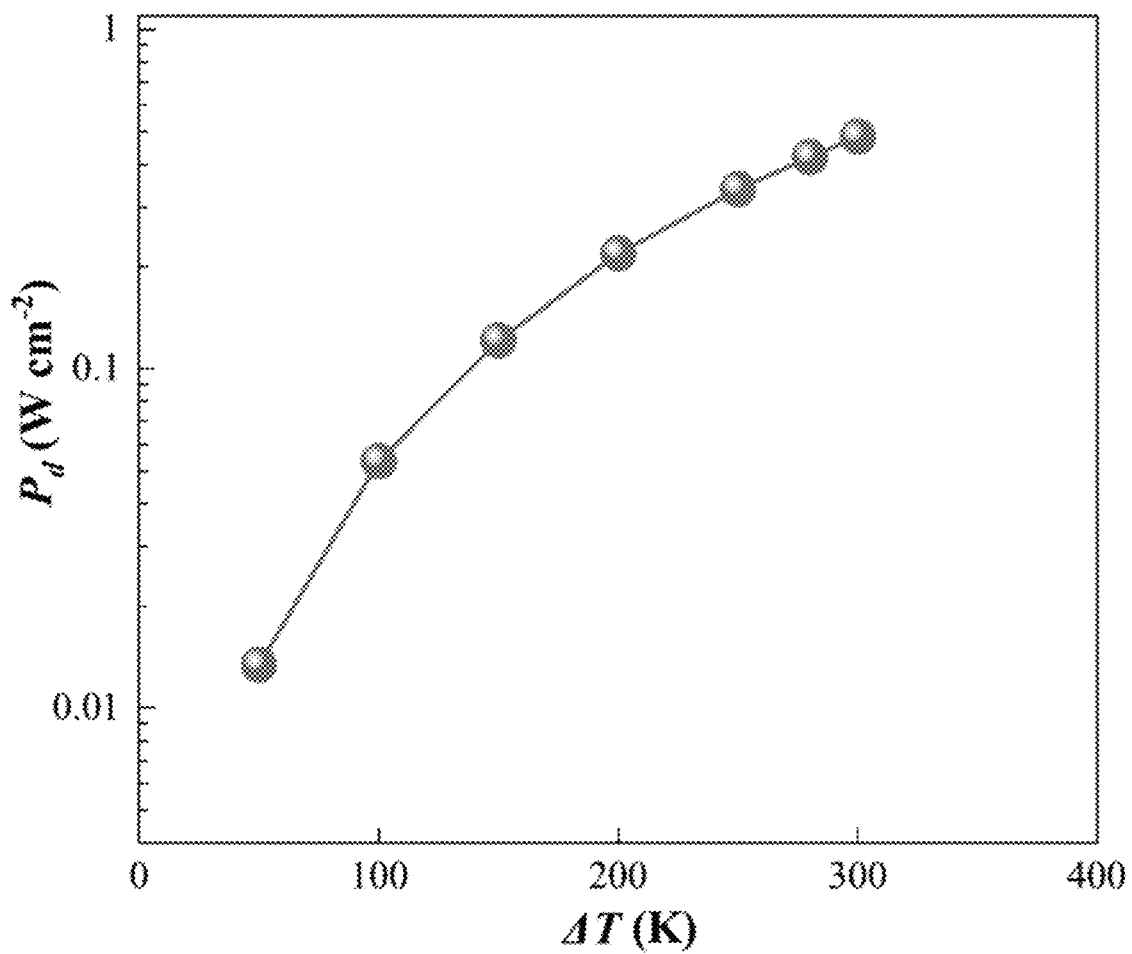
FIG. 7 is a curve diagram of the output power density of the $MgCu_{0.1}Ag_{0.87}Sb_{0.99}$—$Mg_{3.2}Bi_{1.5}Sb_{0.5}$ thermoelectric generation device prepared in a first embodiment along with temperature difference change.

FIG. 7 is a curve diagram of the output power density of the $MgCu_{0.1}Ag_{0.87}Sb_{0.99}$—$Mg_{3.2}Bi_{1.5}Sb_{0.5}$ thermoelectric generation device prepared in a first embodiment along with temperature difference change. It can be seen that as the temperature increases, the output power density of the device gradually increases; and the output power density of the device reaches 0.48 $Wcm^{-2}$ at the low temperature of 293K and the high temperature of 593K (namely temperature difference of 300K).

The excellent performance of the device comes from both the good thermoelectric performance of the material and the low contact resistance of the device.

Figure 8:
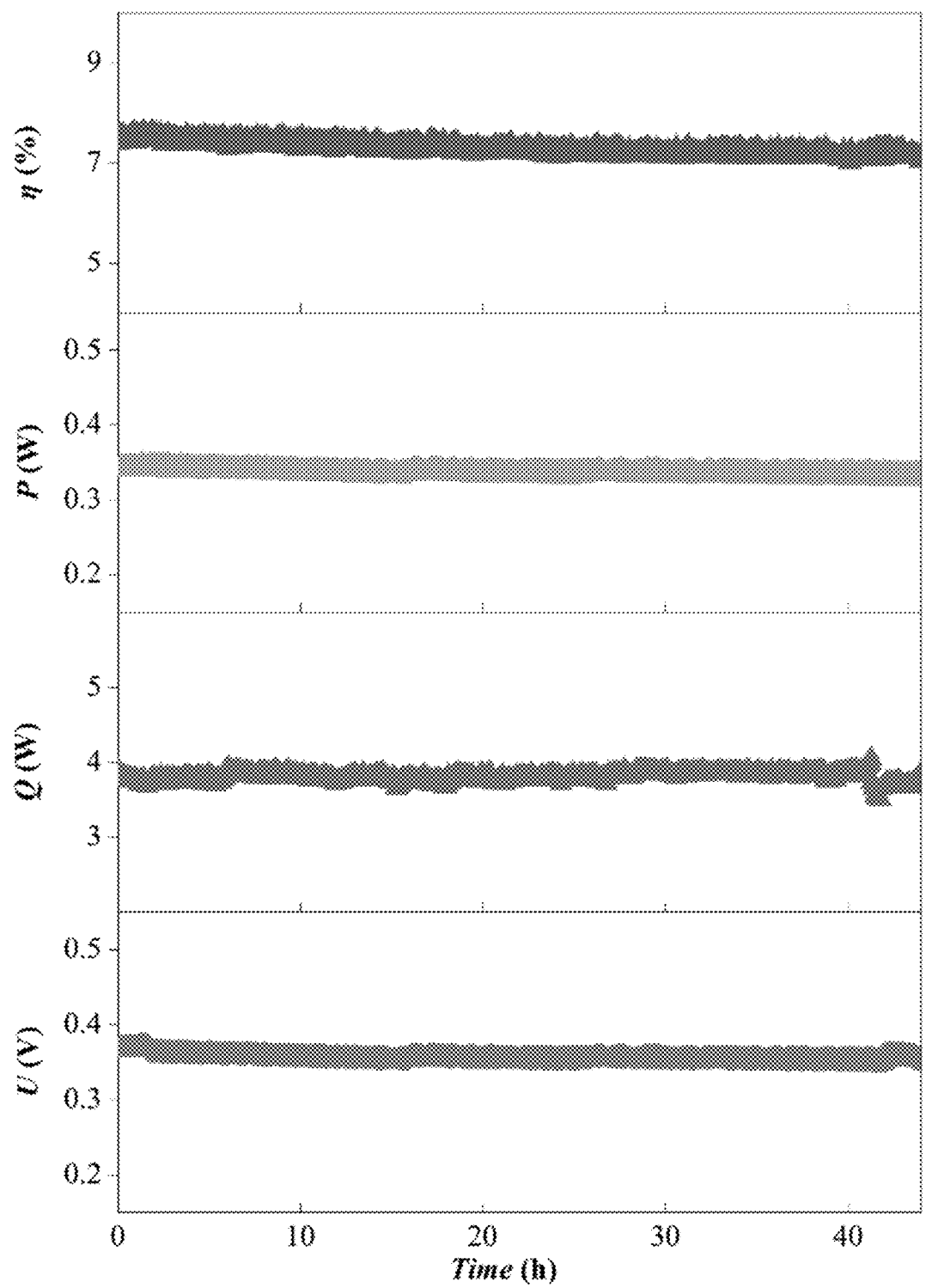
FIG. 8 is a diagram of a conversion efficiency η, an output power P, an input heat Q, and voltage U of the prepared $MgCu_{0.1}Ag_{0.87}Sb_{0.99}$—$Mg_{3.2}Bi_{1.5}Sb_{0.5}$ thermoelectric generation device tested continuously at the high temperature end of 553K and the low temperature end of 293K in a first embodiment.

FIG. 8 is a diagram of a conversion efficiency η, an output power P, an input heat Q, and voltage U of the prepared $MgCu_{0.1}Ag_{0.87}Sb_{0.99}$—$Mg_{3.2}Bi_{1.5}Sb_{0.5}$ thermoelectric generation device tested continuously at the high temperature end of 553K and the low temperature end of 293K in a first embodiment. It can be seen that after 44 hours of test, the performance of the device has no obvious degradation, showing the device has extremely high thermal stability and the contact materials has extremely high thermal stability during high-temperature service.

FIG. 9 is a real picture of the $MgCu_{0.1}Ag_{0.87}Sb_{0.99}$—$Mg_{3.2}Bi_{1.5}Sb_{0.5}$ thermoelectric generation device prepared in a first embodiment.

What is claimed is:

1. A preparation method of a contact material based thermoelectric material, comprising the following steps:
    at step 1, in an argon atmosphere with a water oxygen content lower than 1 ppm, based on a stoichiometric ratio of a chemical formula MgCuSb, weighing Mg chips, Cu wires and Sb granules, and then, in a glove box, placing the weighed Mg chips, Cu wires, and Sb granules into a stainless steel ball mill tank and then placing stainless steel balls in and sealing the tank tightly to obtain a sealed ball mill tank; in an air atmosphere, placing the sealed ball mill tank into a ball mill machine for high-speed ball milling to obtain an MgCuSb nano-powder;
    at step 2, in an argon atmosphere with a water oxygen content lower than 1 ppm, based on a stoichiometric ratio of a chemical formula $MgCu_{0.1}Ag_{0.87}Sb_{0.99}$, weighing Mg granules, Ag chips, Cu wires, and Sb granules, and obtaining an $MgCu_{0.1}Ag_{0.87}Sb_{0.99}$ nano-powder by ball milling; and
    at step 3, using the $MgCu_{0.1}Ag_{0.87}Sb_{0.99}$ nano-powder as a p-type material and the MgCuSb nano-powder as a contact material of the p-type material; meanwhile, using $Mg_{3.2}Bi_{1.5}Sb_{0.5}$ as an n-type material, and Fe as a contact material of the n-type material, so as to prepare an $MgCu_{0.1}Ag_{0.87}Sb_{0.99}$—$Mg_{3.2}Bi_{1.5}Sb_{0.5}$ thermoelectric generation device.

2. The preparation method of claim 1, wherein the high-speed ball milling in the step 1 specifically refers to high-speed ball milling for 18 h to 22 h under the condition of 1000 r/m to 1500 r/m of a motor.

3. The preparation method of claim 1, wherein in the step 2, in an argon atmosphere with a water oxygen content lower than 1 ppm, adding the Mg granules and Ag chips into the stainless steel ball mill tank and placing stainless steel balls in and sealing the tank tightly to obtain the sealed ball mill tank; in an air atmosphere, placing the sealed ball mill tank into the ball mill machine to perform high-speed ball milling for 9 h to 11 h under the condition of 1000 r/m to 1500 r/m of the motor; then, in an argon atmosphere with a water oxygen content lower than 1 ppmm, opening the ball mill tank, and adding the Cu wires and Sb granules and then sealing the tank tightly, and continuing high-speed ball milling for 9 h to 11 h under the condition of 1000 r/m to 1500 r/m of the motor, and in an argon atmosphere with a water oxygen content lower than 1 ppmm, opening the ball mill tank to obtain the $MgCu_{0.1}Ag_{0.87}Sb_{0.99}$ nano-powder.

4. The preparation method of claim 1, wherein in the step 3, using the $MgCu_{0.1}Ag_{0.87}Sb_{0.99}$ nano-powder as the p-type material and the MgCuSb nano-powder as the contact materials material of the p-type material specifically comprises the following steps: placing the MgCuSb nano-powder into a graphite mould and flattening the MgCuSb nano-powder to obtain a first MgCuSb layer; placing the $MgCu_{0.1}Ag_{0.87}Sb_{0.99}$ nano-powder on the first MgCuSb layer and flattening the $MgCu_{0.1}Ag_{0.87}Sb_{0.99}$ nano-powder to obtain an $MgCu_{0.1}Ag_{0.87}Sb_{0.99}$ layer, and then placing MgCuSb nano-powder on the $MgCu_{0.1}Ag_{0.87}Sb_{0.99}$ layer and flattening the MgCuSb nano-powder to obtain a second MgCuSb layer, thus obtaining a mould loaded with MgCuSb—MgAgSb—MgCuSb; in an air atmosphere, placing the mould loaded with MgCuSb—MgAgSb—MgCuSb into an induction heating sintering furnace for sintering and cooling along with the furnace to obtain an MgCuSb—MgAgSb—MgCuSb sandwich structure sheet, and cutting the MgCuSb—MgAgSb—MgCuSb sandwich structure sheet into strips so as to obtain MgCuSb—MgAgSb—MgCuSb test pieces.

5. The preparation method of claim 4, wherein the sintering specifically comprises: under the condition of a furnace pressure lower than 10 Pa, at a temperature increasing rate of 80 K/min to 120 K/min, increasing a temperature of 563 K to 583 K, and then sintering for 20 min to 40 min under the condition of a sintering temperature of 563 K to 583 K and a pressure of 80 MPa to 90 MPa.

6. The preparation method of claim 4, wherein a height of the MgCuSb—MgAgSb—MgCuSb test pieces is 2.5 mm to 3.5 mm.

7. The preparation method of claim 1, wherein in the step 3, using the $Mg_{3.2}Bi_{1.5}Sb_{0.5}$ as the n-type material and Fe as the contact materials material of the n-type material specifically comprises the following steps: placing Fe powder into a graphite mould and flattening the Fe powder to obtain a first Fe layer; placing the $Mg_{3.2}Bi_{1.5}Sb_{0.5}$ nano-powder on the first Fe layer and flattening the $Mg_{3.2}Bi_{1.5}Sb_{0.5}$ nano-powder to obtain an MgBiSb layer, and then placing Fe powder on the MgBiSb layer and flattening the Fe powder to obtain a second Fe layer, thus obtaining a mould loaded with Fe—MgBiSb—Fe; in an air atmosphere, placing the mould loaded with Fe—MgBiSb—Fe in the induction heating sintering furnace for sintering and cooling along with the furnace to obtain a Fe—MgBiSb—Fe sandwich structure sheet and cutting the Fe—MgBiSb—Fe sandwich structure sheet into strips to obtain Fe—MgBiSb—Fe test pieces.

8. The preparation method of claim 7, wherein the sintering specifically comprises: under the condition of the furnace pressure lower than 10 Pa, at the temperature, increasing rate of 80 K/min to 120 K/min, increasing the temperature of 1053 K to 1093 K and then sintering for 15 min to 30 min under the condition of the sintering temperature of 1053 K to 1093 K and the pressure of 40 MPa to 60 MPa.

9. The preparation method of claim 7, wherein a height of the Fe—MgBiSb—Fe test pieces is 2.5 mm to 3.5 mm.

10. The preparation method of claim 1, wherein in the step 3, the $MgCu_{0.1}Ag_{0.87}Sb_{0.99}$—$Mg_{3.2}Bi_{1.5}Sb_{0.5}$ thermoelectric generation device is assembled by seven p-n pairs of $MgCu_{0.1}Ag_{0.87}Sb_{0.99}$—$Mg_{3.2}Bi_{1.5}Sb_{0.5}$.

* * * * *